(12) United States Patent
Kwon et al.

(10) Patent No.: US 8,354,313 B2
(45) Date of Patent: Jan. 15, 2013

(54) METHOD TO OPTIMIZE WORK FUNCTION IN COMPLEMENTARY METAL OXIDE SEMICONDUCTOR (CMOS) STRUCTURES

(75) Inventors: Unoh Kwon, Fishkill, NY (US); Dechao Guo, Wappinger Falls, NY (US); Siddarth A. Krishnan, Peekskill, NY (US); Ramachandran Muralidhar, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 155 days.

(21) Appl. No.: 12/770,792

(22) Filed: Apr. 30, 2010

(65) Prior Publication Data

US 2011/0269276 A1    Nov. 3, 2011

(51) Int. Cl.
*H01L 21/8236* (2006.01)
*H01L 21/8234* (2006.01)
*H01L 21/4763* (2006.01)

(52) U.S. Cl. ........ 438/199; 438/197; 438/287; 438/585; 438/591; 257/E21.202; 257/E21.444; 257/E21.632; 257/E21.637

(58) Field of Classification Search ........... 257/E21.202, 257/E21.444, E21.632, E21.637
See application file for complete search history.

(56) References Cited

U.S. PATENT DOCUMENTS

| 7,838,356 B2 * | 11/2010 | Kirkpatrick et al. ......... 438/199 |
|---|---|---|
| 7,902,599 B2 * | 3/2011 | Carter et al. ................. 257/334 |
| 7,977,181 B2 * | 7/2011 | Lai et al. ....................... 438/199 |
| 2006/0046448 A1 * | 3/2006 | Barns et al. .................. 438/585 |
| 2006/0071285 A1 * | 4/2006 | Datta et al. ................... 257/407 |
| 2006/0246740 A1 * | 11/2006 | Cartier et al. ................ 438/778 |
| 2007/0108525 A1 | 5/2007 | Yang et al. |
| 2008/0277726 A1 * | 11/2008 | Doris et al. ................... 257/351 |
| 2009/0283535 A1 * | 11/2009 | Mesalic ........................ 220/709 |
| 2010/0159684 A1 * | 6/2010 | Chang et al. ................. 438/585 |
| 2010/0258881 A1 * | 10/2010 | Chudzik et al. .............. 438/591 |
| 2011/0111586 A1 * | 5/2011 | Colombo et al. ............. 438/592 |
| 2011/0221009 A1 * | 9/2011 | Chuang et al. ............... 257/392 |

* cited by examiner

*Primary Examiner* — Mohsen Ahmadi
(74) *Attorney, Agent, or Firm* — Scully, Scott, Murphy & Presser, P.C.; H. Daniel Schnurmann

(57) ABSTRACT

In one embodiment, the method for forming a complementary metal oxide semiconductor (CMOS) device includes providing a semiconductor substrate including a first device region and a second device region. An n-type conductivity semiconductor device is formed in one of the first device region or the second device region using a gate structure first process, in which the n-type conductivity semiconductor device includes a gate structure having an n-type work function metal layer. A p-type conductivity semiconductor device is formed in the other of the first device region or the second device region using a gate structure last process, in which the p-type conductivity semiconductor device includes a gate structure including a p-type work function metal layer.

12 Claims, 4 Drawing Sheets

METHOD TO OPTIMIZE WORK FUNCTION IN COMPLEMENTARY METAL OXIDE SEMICONDUCTOR (CMOS) STRUCTURES

BACKGROUND

The present disclosure relates to semiconductor devices. More particularly, the present disclosure relates to forming gate structures for CMOS semiconductor devices.

Field effect transistors (FETs) are widely used in the electronics industry for switching, amplification, filtering and other tasks related to both analog and digital electrical signals. Most common among these are metal oxide semiconductor field effect transistors (MOSFET or MOS), in which a gate structure is energized to create an electric field in an underlying channel region of a semiconductor body, by which electrons are allowed to travel through the channel between a source region and a drain region of the semiconductor body. Complementary MOS (CMOS) devices have become widely used in the semiconductor industry, wherein both n-type and p-type (NMOS and PMOS) transistors are used to fabricate logic and circuitry.

Continuing trends in semiconductor device manufacturing include a reduction in electrical device feature size (scaling), as well as improvements in device performance in terms of device switching speed and power consumption. Recent MOS and CMOS transistor scaling efforts have focused on high-k dielectric materials having dielectric constants greater than that of $SiO_2$ (e.g., greater than about 3.9), which can be formed in a thicker layer than scaled $SiO_2$, and yet which produce equivalent field effect performance.

SUMMARY

The present disclosure provides a method for forming a complementary metal oxide semiconductor (CMOS) device that includes forming gate structures with metal layers that are present therein having compositions selected for adjusting the work function of the corresponding n-type or p-type semiconductor device. In one embodiment, the method for forming a complementary metal oxide semiconductor (CMOS) device includes providing a semiconductor substrate including a first device region and a second device region. An n-type conductivity semiconductor device is formed in one of the first device region or the second device region using a gate structure first process, in which the n-type conductivity semiconductor device includes a gate structure having an n-type work function metal layer. A p-type conductivity semiconductor device is formed in the other of the first device region or the second device region using a gate structure last process, in which the p-type conductivity semiconductor device includes a gate structure including a p-type work function metal layer.

In another embodiment, a method of forming a complementary metal oxide semiconductor (CMOS) device is provided that includes providing a semiconductor substrate including a first device region and a second device region. A first gate stack in the first device region and a second gate stack in the second device region are formed, in which each of the first gate stack and the second gate stack include a gate dielectric that is present on the semiconductor substrate and a first conductivity type work function metal layer that is present on the gate dielectric. Source regions and drain regions of a first conductivity type dopant are formed in the first device region adjacent to the first gate stack, and source and drain regions of a second conductivity type dopant are formed in the second device region adjacent to the second stack. At least one dielectric layer is formed atop the first device region and the second device region, wherein the at least one dielectric layer has an upper surface that is coplanar with an upper surface of the first gate stack and the second gate stack. The first conductivity type work function metal layer is removed from the second gate stack to expose the gate dielectric in the second device region. The first conductivity type work function metal layer remains in the first gate stack that is present in the first device region. A second conductivity type work function metal layer is formed on the gate dielectric that is present in the second device region. The first gate stack that is composed of the first conductivity type work function metal layer and the gate dielectric is the gate structure to a first conductivity type semiconductor device. The second gate stack that is composed of the second conductivity type work function metal layer and the gate dielectric is the gate structure to a second conductivity type semiconductor device.

In yet another embodiment, a method of forming a complementary metal oxide semiconductor (CMOS) device is provided that includes a semiconductor substrate comprising a first device region and a second device region. A first gate stack is formed in the first device region and a second gate stack is formed in the second device region. Each of the first gate stack and the second gate stack include a gate dielectric that is present on the semiconductor substrate and an n-type work function metal layer that is present on the gate dielectric. Source regions and drain regions of an n-type dopant are formed in the first device region adjacent to the first gate stack. Source and drain regions of a p-type dopant are formed in the second device region adjacent to the second stack. At least one dielectric layer is formed atop the first device region and the second device region. The at least one dielectric layer has an upper surface that is coplanar with an upper surface of the first gate stack and the second gate stack. The n-type work function metal layer is removed from the second gate stack to expose the gate dielectric in the second device region, wherein the n-type work function metal layer remains in the first gate stack that is present in the first device region. The p-type work function metal layer is formed on the gate dielectric that is present in the second device region, wherein the first gate stack comprising the n-type work function metal layer and the gate dielectric is the gate structure to an n-type semiconductor device. The second gate stack comprising the p-type work function metal layer and the gate dielectric is the gate structure to a p-type semiconductor device.

DESCRIPTION OF THE SEVERAL VIEWS OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION OF THE INVENTION

Figure 1:
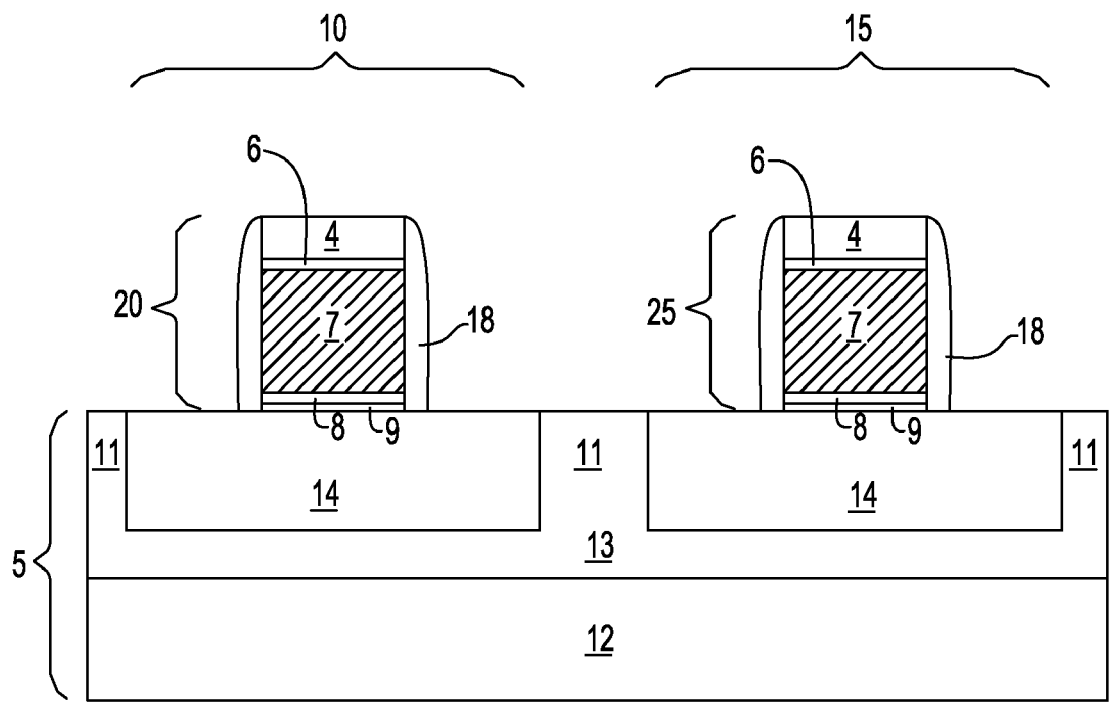
FIG. 1 is a side cross-sectional view depicting an initial structure as used in one embodiment of the method disclosed herein, wherein a semiconductor substrate is provided having a first device region and a second device region, and a first and second gate stack comprising an n-type conductivity work function metal layer is present in each of the first device region and the second device region.

Detailed embodiments of the present invention are disclosed herein; however, it is to be understood that the disclosed embodiments are merely illustrative of the invention that may be embodied in various forms. In addition, each of the examples given in connection with the various embodiments of the invention is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

The present disclosure relates to structures and methods for forming complementary metal oxide semiconductor (CMOS) devices, in which the gate structures to the semiconductor devices have a composition to provide a work function tailored to the conductivity type of the corresponding semiconductor device of the gate structure.

In one embodiment, the method for forming a complementary metal oxide semiconductor (CMOS) device includes forming an n-type conductivity semiconductor device in a first device region of a semiconductor substrate using a gate structure first process, and forming a p-type conductivity semiconductor device in the second device region using a gate structure last process, which is considered to be beneficial to optimize metal workfunction suitable for PFET device. The p-type conductivity semiconductor device includes a gate structure including a p-type work function metal layer, and the n-type conductivity semiconductor device includes a gate structure having an n-type work function metal layer.

The term "gate structure first" means that a functional gate structure is formed on the semiconductor substrate prior to the source and drain regions of the semiconductor device. As used herein, a functional gate structure is used to control output current (i.e., flow of carriers in the channel) of a semiconducting device through electrical or magnetic fields. Typically, the functional gate structure includes at least one gate conductor and at least one gate dielectric. The term "gate structure last" means that a replacement gate structure is utilized to determine the position for the later formed functional gate structure that is substituted for the replacement gate once the existing gate structure has been removed. The replacement gate material may be any material that can occupy the space in which the subsequently formed functional gate structure is to be positioned.

Reference is first made to FIG. 1, which depicts an initial structure as used in one embodiment of the method disclosed herein. The initial structure may include a semiconductor substrate 5 having a first device region 10 and a second device region 15. A first gate stack 20 is present in the first device region 10 and a second gate stack 25 is present in the second device region 15, in which each of the first gate stack 20 and the second gate stack 25 include a same conductivity work function metal (preferably an n-type) layer 8.

In one embodiment, the semiconductor substrate 5 comprises a semiconductor-on-insulator substrate (SOI) which includes a bottom semiconductor-containing layer 12, a buried insulating layer 13 present atop the bottom semiconductor-containing layer 12, and atop semiconductor-containing layer (i.e., SOI layer) 14 atop the surface of the buried insulating layer 13. In one embodiment, the bottom and top semiconductor-containing layers 12, 14 are composed of a Si-containing material. The term "Si-containing material" as used herein denotes any semiconductor material that includes silicon. Illustrative examples of various Si semiconductor materials that can be employed in the present invention include, but are not limited to: Si, SiGe, SiGeC, SiC and other like Si-containing materials. Combinations of the aforementioned semiconductor materials can also be used as the Si-containing layers of the SOI substrate.

The top semiconductor-containing layer 14 (hereafter referred to as the first semiconductor-containing layer) may have a thickness ranging from 20.0 nm to 80.0 nm. The buried insulating layer 13 is typically a buried oxide region, which may have a thickness ranging from 100.0 nm to 200.0 nm.

The semiconductor substrate 5 shown in FIG. 1 may be formed by a thermal bonding process, or by an oxygen implantation process, which is referred to in the art as a separation by implantation of oxygen (SIMOX). In another embodiment, the semiconductor substrate 5 that is depicted in FIG. 1 may be a bulk semiconductor-containing substrate, such as bulk silicon.

An isolation region 11 may be formed in the semiconductor substrate 5, which may provide the boundary between a first device region 10 and a second device region 15. In one embodiment, the first device region 10 provides the site for a subsequently formed p-type conductivity semiconductor device, and the second device region 15 provides the site for a subsequently formed n-type conductivity semiconductor device. The term "semiconductor device" refers to an intrinsic semiconductor material that has been doped, i.e., into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentrations in an extrinsic semiconductor classify it as either an n-type or p-type semiconductor. As used herein, "p-type conductivity" refers to the addition of trivalent impurities to a semiconductor material that create deficiencies of valence electrons, such as boron, aluminum or gallium to an intrinsic silicon substrate. As used herein, "n-type conductivity" refers to the addition of pentavalent impurities to a semiconductor substrate that contribute free electrons, such as antimony, arsenic or phosphorous to an intrinsic Si substrate. A "p-type conductivity semiconductor device" is a semiconductor device, in which the source and drain regions of the device are doped to a p-type conductivity. An "n-type conductivity semiconductor device" is a semiconductor device, in which the source and drain regions of the device are doped to an n-type conductivity.

The isolation region 11 may be a shallow trench isolation (STI) region formed by etching a trench into at least the first semiconductor-containing layer 14 of the semiconductor substrate 5. In some embodiments, and as shown, the trench has a bottom surface that contacts an upper surface of the buried insulating layer 13. The etching step may be performed utilizing a dry etching process, such as reactive-ion etching, ion beam etching, laser ablation or any combination thereof. Chemical vapor deposition (CVD) or another like deposition process can be used to fill the trench with an STI dielectric material, such as a high-density plasma (HDP) oxide or TEOS (tetraethylorthosilicate). The isolation region 11 may also be formed by local oxidation (LOCOS) or by an oxide mesa formation process.

FIG. 1 further depicts forming a first gate stack 20 in the first device region 10, and a second gate stack 25 in the second device region 15. Each of the first gate stack 20 and the second gate stack 25 includes a gate dielectric 9 that is present on the semiconductor substrate 5 and an n-type work function metal layer 8 that is present on the gate dielectric 9. In one embodiment, each of the first gate stack 20 and the second gate stack 25 includes a semiconductor-containing material 7 that is present on the n-type work function metal layer 8, an etch stop layer 6 that is present on the semiconductor-containing material 7, a first hardmask dielectric layer 4 that is present on the etch stop layer 6, and an optional second hardmask dielectric layer (not shown) that may be present on the first hardmask dielectric layer 4.

The first and second gate stacks 20, 25 are formed on the semiconductor substrate 5 using photolithography and etching. First, each of the gate dielectric 9, n-type work function metal layer 8, semiconductor-containing material 7, etch stop layer 6, first hardmask dielectric layer 4 and the optional second hardmask dielectric layer (not shown) are sequentially blanket deposited on the semiconductor substrate 5. Thereafter, the blanket deposited layers are patterned by photolithography and etching to form the first and second gate stacks 20, 25.

The gate dielectric 9 may be composed of any dielectric including, but not limited to: $SiO_2$; $Si_3N_4$; SiON; temperature sensitive high-k dielectrics such as $TiO_2$, $Al_2O_3$, $ZrO_2$, $HfO_2$, $Ta_2O_5$, $La_2O_3$; and other like oxides including perovskite-type oxides. In one embodiment, the gate dielectric 9 may be formed by a thermal growth process such as, for example, oxidation, nitridation or oxynitridation. The gate dielectric 9 may also be formed by a deposition process such as, for example, chemical vapor deposition (CVD), plasma-assisted CVD, metal organic chemical vapor deposition (MOCVD), atomic layer deposition (ALD), evaporation, reactive sputtering, chemical solution deposition and other like deposition processes. Chemical Vapor Deposition (CVD) is a deposition process in which a deposited species is formed as a results of chemical reaction between gaseous reactants at an elevated temperature (typically being greater than 600° C.), wherein solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD) and Plasma Enhanced CVD (EPCVD), Metal-Organic CVD (MOCVD) and others.

In one embodiment, the gate dielectric 9 is composed of a high-k dielectric layer. A high-k dielectric is a material having a dielectric constant that is greater than the dielectric constant of silicon oxide. In one embodiment, the high-k dielectric layer is comprised of a high-k dielectric material having a dielectric constant greater than about 4.0, e.g., 4.1. In another embodiment, the high-k dielectric layer is comprised of a high-k dielectric material having a dielectric constant greater than 7.0. In yet another embodiment, the high-k dielectric layer is comprised of a high-k dielectric material having a dielectric constant ranging from greater than 4.0 to 30. The dielectric constants mentioned herein are relative to a vacuum.

Some examples of high-k dielectric materials suitable for the high-k dielectric layer include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In one example, the high-k dielectric layer has a thickness ranging from 1.0 nm to 10.0 nm. In one embodiment, the high-k dielectric layer is hafnium oxide ($HfO_2$).

The n-type work function metal layer 8 is formed in direct contact with an upper surface of the gate dielectric 9. As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV.

In one embodiment, the n-type work function metal layer 8 is composed of at least one of TiN, HfN, HfSi, or combinations thereof. The n-type work function metal layer 8 can be deposited using chemical vapor deposition (CVD), atomic layer deposition (ALD), sputtering or plating. In one embodiment, the n-type work function metal layer 8 is composed of TiN and is deposited using sputtering. In one example, an n-type work function metal layer 8 composed of TiN is sputtered from a solid titanium target, in which the nitrogen content of the metal nitride layer is introduced by a nitrogen gas. In another example, an n-type work function metal layer 8 composed of TiN is sputtered from a solid target comprised of titanium and nitrogen. The n-type work function metal layer 8 typically has a thickness ranging from 1 nm to 10 nm.

The semiconductor-containing material 7 may be formed in direct contact with an upper surface of the n-type work function metal layer 8. The semiconductor-containing material may be a silicon-containing material. The term "silicon-containing material" as used herein denotes any semiconductor material that includes silicon. Illustrative examples of various silicon semiconductor materials that can be employed in the present invention include, but are not limited to: Si, SiGe, SiGeC, SiC and other like Si-containing materials. The semiconductor-containing material 7 may also be a germanium-containing material. The semiconductor-containing material 7 may be doped or un-doped. The semiconductor-containing material 7 may be formed using a deposition process, including but not limited to: low pressure chemical vapor deposition or room temperature chemical vapor deposition. The semiconductor-containing material 7 may have a thickness ranging from 20.0 nm to 200.0 nm. In another embodiment, the semiconductor-containing material 7 may have a thickness ranging from 100.0 nm to 175.0 nm.

The etch stop layer 6 may be formed in direct contact with an upper surface of the semiconductor-containing material 7. The etch stop layer 6 may be formed using thermal growth, e.g., thermal oxidation, or deposition processes, e.g., chemical vapor deposition. The etch stop layer 6 may be composed of an oxide, nitride or oxynitride material. In one embodiment, the etch stop layer 6 is composed of silicon oxide. The etch stop layer 6 may have a thickness ranging from 3.0 nm to 25.0 nm.

The first hard mask dielectric layer 4 can be formed on an upper surface of the etch stop layer 6. The first hard mask dielectric layer 4 may be composed of a nitride, oxide or oxynitride material. The first hard mask dielectric layer 4 may be deposited by chemical vapor deposition (CVD). Variations of CVD processes suitable for depositing the first hard mask dielectric layer 4 include, but are not limited to, Atmospheric Pressure CVD (APCVD), Low Pressure CVD (LPCVD) and Plasma Enhanced CVD (EPCVD), Metal-Organic CVD (MOCVD) and combinations thereof. In one embodiment, the first hard mask dielectric layer 4 is composed of silicon nitride. The first hard mask dielectric layer 4 may have a thickness ranging from 5.0 nm to 35.0 nm. The second hard mask dielectric layer may optionally be formed atop the first hard mask dielectric layer 4, and may be composed of a material having a different etch selectivity than the first hard mask dielectric layer 4. In one embodiment, the second hard mask dielectric layer is composed of an oxide, such as silicon oxide.

The first gate stack 20 and the second gate stack 25 are then formed from the above described blanket deposited material layers using photolithography and etching. More specifically, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected while the exposed regions are removed using a selective etching process that removes the unprotected regions. The term "selective" in reference to a material removal process denotes that the rate of material removal for a first material is greater than the rate of removal for at least another material of the structure to which the material removal process is being applied. The patterned resist is then removed using an $O_2$ ash process, or the patterned resist may be stripped using a wet chemical process.

Still referring to FIG. 1, at least one spacer 18 (also referred to as the first spacer 18) may be optionally formed on the sidewall of each of the first and second gate stacks 20, 25 using deposition and etch processes. In one embodiment, the at least one spacer 18 has a width measured at the base of the at least one spacer 18 ranging from 3 nm to 40 nm. In another embodiment, the at least one spacer 18 has a width measured at the base of the at least one spacer 18 ranging from 5.0 nm to 20.0 nm. The at least one spacer's 18 width may taper, i.e., may reduce, in the direction from the semiconductor substrate 5 towards the upper surface of the first gate stack 20 and the second gate stack 25. The at least one spacer 18 may be comprised of a dielectric material, such as a nitride, e.g., silicon nitride.

Figure 2:
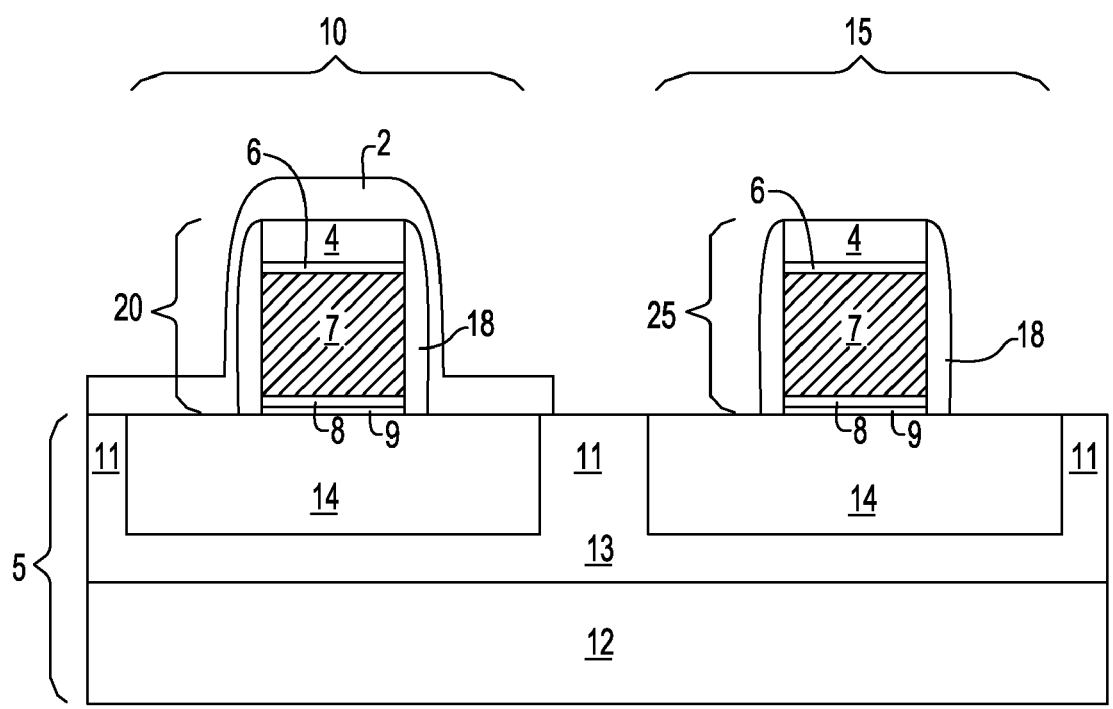
FIG. 2 is a side cross-sectional view depicting forming an embedded SiGe well adjacent to the second gate stack of the second device region, in which a p-type conductivity semiconductor device will subsequently be formed, in accordance with the present method.

FIG. 2 depicts one embodiment of forming compressive strain inducing wells 3 adjacent to the second gate stack 25 of the second device region 15. The compressive strain inducing wells 3 produce a compressive strain within the device channel of the subsequently formed p-type conductivity semiconductor device. The compressive strain inducing wells 3 may be composed of intrinsically compressive semiconductor material that has been epitaxially grown atop a surface of the first semiconductor-containing layer 14, in which the epitaxially grown material has a larger lattice structure than the surface on which it is being grown. In one example, the compressive strain is produced by a lattice mismatch between the larger lattice dimension of epitaxially grown SiGe, and the smaller lattice dimension of the silicon surface of the first semiconductor-containing layer 14 on which the SiGe is epitaxially grown.

In one embodiment, the compressive strain inducing wells 3 are formed on recessed surfaces of the first semiconductor-containing layer 14 adjacent to the second gate stack 15 in the second device region 20. The recessed surfaces of the first semiconductor-containing layer 14 may be formed by depositing a first protective dielectric layer 2 over the first device region 10, and etching the exposed surface of the first semiconductor-containing layer 14 in the second device region 15 using an etch process that is selective to at least the first protective dielectric layer 2 and the first hard mask dielectric layer 4 that is present in the second gate stack 25.

In one example, the first protective dielectric layer 2 is blanket deposited over the first device region 10 and the second device region 15. The first protective dielectric layer 2 may be deposited using chemical vapor deposition (CVD), such as plasma enhanced chemical vapor deposition (PECVD). The blanket deposited first protective dielectric layer 2 is then patterned and etched using photolithography and selective etching. For example, an etch mask, e.g., photoresist mask, may be formed over the portion of the blanket deposited first protective dielectric layer 2 that is overlying the first device region 10, and an etch process may remove the exposed portion of the first protective dielectric layer 2 selective to the underlying materials of the second device region 15. The first protective dielectric layer 2 may be an oxide, nitride, or oxynitride material. In one embodiment, in which the first hard mask dielectric layer 4 is composed of silicon nitride, the first protective dielectric layer 2 is also composed of silicon nitride.

Using the patterned first protective dielectric layer 2 and the first hard mask dielectric layer 4 of the second gate stack 25 as an etch mask, the first semiconductor-containing layer 14 that is present in the second device region 15 is etched to provide a recessed surface on each side of the second gate stack 25. In one embodiment, the etch process removes the material of the first semiconductor-containing layer 14 selective to the first protective dielectric layer 2 and the first hard mask dielectric layer 4. The etch process may be an anisotropic etch. The term "anisotropic etch" denotes a material removal process in which the etch rate in the direction normal to the surface to be etched is higher than in the direction parallel to the surface to be etched. One example of an anisotropic etch that is suitable for forming the recessed surfaces of the first semiconductor-containing layer 14 is Reactive Ion Etch (RIE). Reactive Ion Etching (RIE) is a form of plasma etching that during etching the surface to be etched is placed on the RF powered electrode, wherein the surface to be etched takes on a potential that accelerates the etching species extracted from a plasma toward the surface, to be etched in which the chemical etching reaction is taking place in the direction normal to the surface. In one embodiment, the etch process continues until the recessed surface of the first semiconductor-containing layer 14 is vertically offset from the surface of the first semiconductor-containing layer 14 that the second gate stack 25 is present on by a dimension ranging from 5 nm to 50 nm. In some embodiments, the recessed surface of the first semiconductor-containing layer 14 is vertically offset from the surface of the first semiconductor-containing layer 14 on which the second gate stack 25 is present by a dimension ranging from 15 nm to 30 nm.

The compressive strain inducing wells 3 are then formed on the recessed surfaces of the first semiconductor-containing layer 14 using epitaxial growth. "Epitaxial growth and/or deposition" means the growth of a semiconductor material on a deposition surface of a semiconductor material, in which the semiconductor material being grown has the same crystalline characteristics as the semiconductor material of the deposition surface. When the chemical reactants are controlled and the system parameters set correctly, the depositing atoms arrive at the surface of the first semiconductor-containing layer 14 with sufficient energy to move around on the surface and orient themselves to the crystal arrangement of the atoms of the deposition surface.

The compressive strain inducing wells 3 may be provided by epitaxial growth of silicon.

A number of different sources may be used for the selective deposition of silicon. Silicon sources for growth of silicon (epitaxial or poly-crystalline) include silicon tetrachloride, dichlorosilane ($SiH_2Cl_2$), and silane ($SiH_4$). The temperature for epitaxial silicon deposition typically ranges from 550° C. to 900° C. Higher temperature typically results in faster deposition, the faster deposition may result in crystal defects and film cracking. The silicon may be doped with Ge to provide a SiGe composition. In one example, germanium may also be introduced to the epitaxially grown silicon by ion implantation. In another embodiment, the Ge may be introduced during the epitaxial growth of the silicon by an in-situ doping process.

The Ge content of the SiGe compressive strain inducing wells 3 may range from 5% to 60%, by atomic weight %. In another embodiment, the Ge content of the SiGe compressive strain inducing wells 3 may range from 10% to 40%. In one embodiment, the SiGe may be epitaxial and under an intrinsic compressive strain, in which the compressive strain is produced by a lattice mismatch between the larger lattice dimension of the SiGe and the smaller lattice dimension of the layer on which the SiGe is epitaxially grown. The first protective dielectric layer 2 may be removed following formation of the compressive strain inducing wells 3. The first protective dielectric layer 2 may be removed using a selective etch process.

Although not depicted in the present Figures, tensile strain inducing wells may be present in the first device region 10 in a portion of the first semiconductor-containing layer 14 that is adjacent to the portion of the first semiconductor-containing layer 14 that is underlying the first gate stack 20. The tensile strain inducing wells may be composed of epitaxially grown Si:C, i.e., carbon doped silicon. The carbon (C) content of the grown Si:C ranges from 0.1% to 10%, by atomic weight %. In another embodiment, the carbon (C) content of the grown Si:C may range from 1% to 2%. The epitaxially grown Si:C is under an intrinsic tensile strain, in which the tensile strain is produced by a lattice mismatch between the smaller lattice dimension of the Si:C and the larger lattice dimension of the layer on which the Si:C is epitaxially grown. But for the composition of the tensile strain inducing wells, the tensile strain inducing wells are formed using a process sequence similar to the process sequence used to form the compressive strain inducing wells 3.

Source regions and drain regions may be formed in the first semiconductor-containing layer 14. A drain region is the doped region in semiconductor device that is located at the end of the channel, in which carriers are flowing out of the semiconductor device, e.g., transistor. The source region is the doped region in the semiconductor device, in which majority carriers are flowing into the channel. The channel is the region underlying the functional gate structures and between the source region and the drain region of a semiconductor device that becomes conductive when the semiconductor device is turned on. In one embodiment, the source and drain regions of the semiconductor device include extension source and drain regions, deep source and drain regions, and halo regions. The source and drain regions may be formed using in-situ doping during the epitaxial growth process that provides the compressive strain inducing wells 3 and/or the tensile strain inducing wells (not shown). Source and drain regions may also be formed using ion implantation.

In the embodiment that is depicted in FIG. 2, source and drain regions having a p-type conductivity are formed in the second device region 15 by in-situ doping the compressive strain inducing wells 3 with a p-type dopant. As used herein, a "p-type dopant" refers to the addition of trivalent impurities to an intrinsic semiconductor that creates deficiencies of valence electrons, such as the addition of boron, aluminum, or gallium to a type IV semiconductor, such as Si. Illustrative examples of p-type dopants include, but are not limited to: B or In. In one example, in which the in-situ doped SiGe compressive strain inducing wells 3 are doped to provide a p-type conductivity, the dopant may be boron present in a concentration ranging from $1 \times 10^{19}$ atoms/cm$^3$ to $2 \times 10^{21}$ atoms/cm$^3$.

Figure 3:
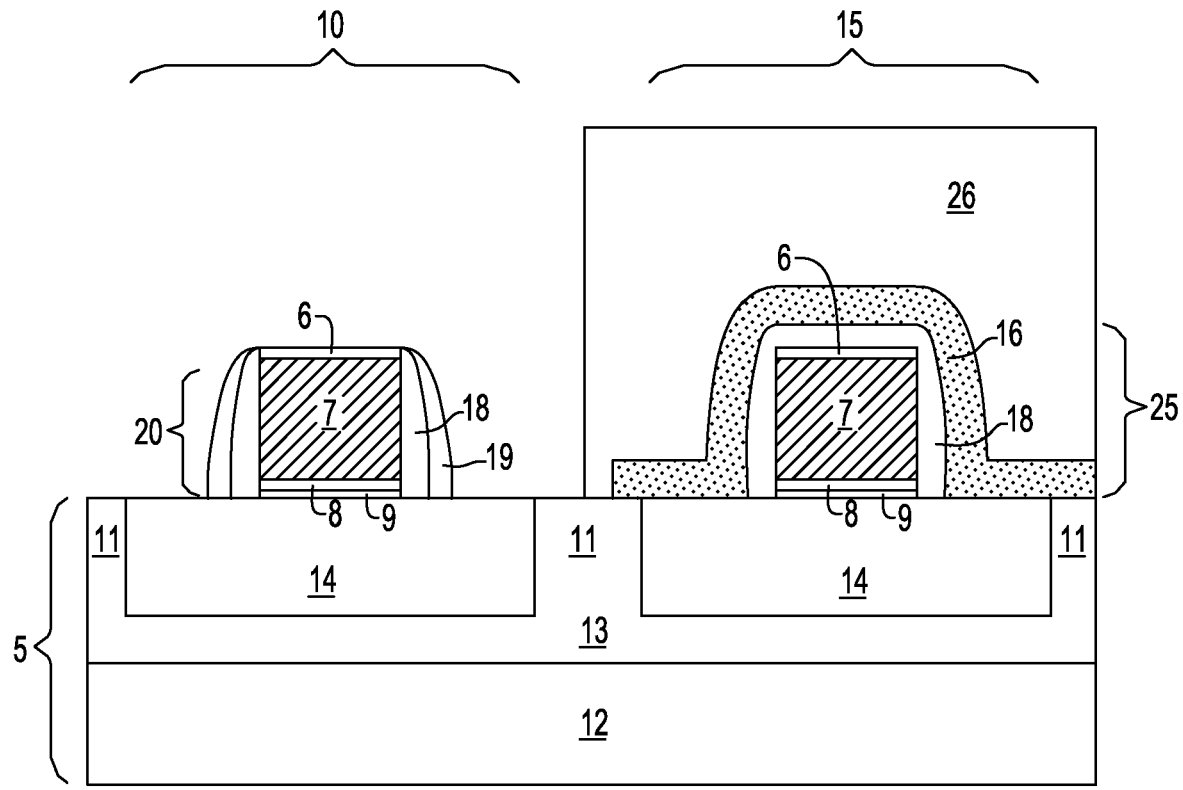
FIG. 3 is a side cross-sectional view depicting forming a block mask over the second device region and forming source and drain regions in the first device region, in accordance with one embodiment of the present method.

FIG. 3 depicting forming a first block mask 26 over the second device region 15 and forming source and drain regions in the first device region 10 using ion implantation. In one embodiment, a second protective dielectric layer 16 is present between beneath the first block mask 26. In one example, the second protective dielectric layer 16 is blanket deposited over the first device region 10 and the second device region 15. The second protective dielectric layer 16 may be deposited using chemical vapor deposition (CVD), such as plasma enhanced chemical vapor deposition (PECVD). The blanket deposited second protective dielectric layer 16 is then patterned and etched using photolithography and selective etching. The second protective dielectric layer 16 may be an oxide, nitride, or oxynitride material. In one embodiment, the second protective dielectric layer 16 is composed of silicon nitride.

In one embodiment, a first block mask 26, e.g., photoresist mask, may be formed over the portion of the blanket deposited second protective dielectric layer 16 that is overlying the second device region 15, and an etch process may remove the exposed portion of the second protective dielectric layer 16 selective to the underlying materials of the second device region 15. In one embodiment, the first block mask 26 is formed using deposition and photolithography. For example, a layer of photoresist is deposited atop the entire structure. The photoresist layer may be comprised of a dielectric including carbon, oxygen, and various inorganic metals. The photoresist layer may be selectively patterned and developed to form the first block mask 26, in which the first block mask 26 is protecting the portion of the second protective dielectric layer 16 that is within the second device region 15 of the semiconductor substrate 5. The first bock mask 26 does not cover the portion of the second protective dielectric layer 16 that is present in the first device region 10. Following the formation of the first block mask 26, an etch process may remove the exposed portion of the second protective dielectric layer 16 selective to the underlying materials of the first device region 10. For example, in one embodiment, the etch chemistry for removing the second protective dielectric layer 16 is selective to the first block mask 26, the upper semiconductor-containing layer 14 and the first gate stack 20 that are present within the first device region 10. The first block mask 26 may be removed following etching of the second protective dielectric layer 16.

Source and drain regions may be formed within the first semiconductor-containing layer 14 in the first device region 10 using an ion implantation process. In the embodiments, in which the source and drain regions of the second device region 15 have a p-type conductivity, the source and drain regions in the first device region 10 are doped to an n-type conductivity. As used herein, doped to an "n-type conductivity" refers to the addition of pentavalent impurities to an intrinsic semiconductor that contribute free electons, such the addition of antimony, arsenic, or phosphorous to a type IV semiconductor, such as Si. The n-type source and drain extension regions can be implanted with arsenic using an energy of 0.5 keV to 5.0 keV with a dose of $3 \times 10^{13}$ atoms/cm$^2$ to $3 \times 10^{16}$ atoms/cm$^2$. Deep source and drain regions are typically the same conductivity as their corresponding source and drain extensions regions, but typically have a greater dopant concentration and are implanted with a higher energy. In some embodiments, prior to the implantation of the dopant for the deep source and drain regions, a second spacer 19 is formed adjacent to the first spacer 18. The second spacer 19 is similar in composition and method of formation to the first spacer 18. The dimensions of the second spacer 19 are selected to determine the positioning of the dopant that forms the deep source and drain ion implantation.

Figure 4:
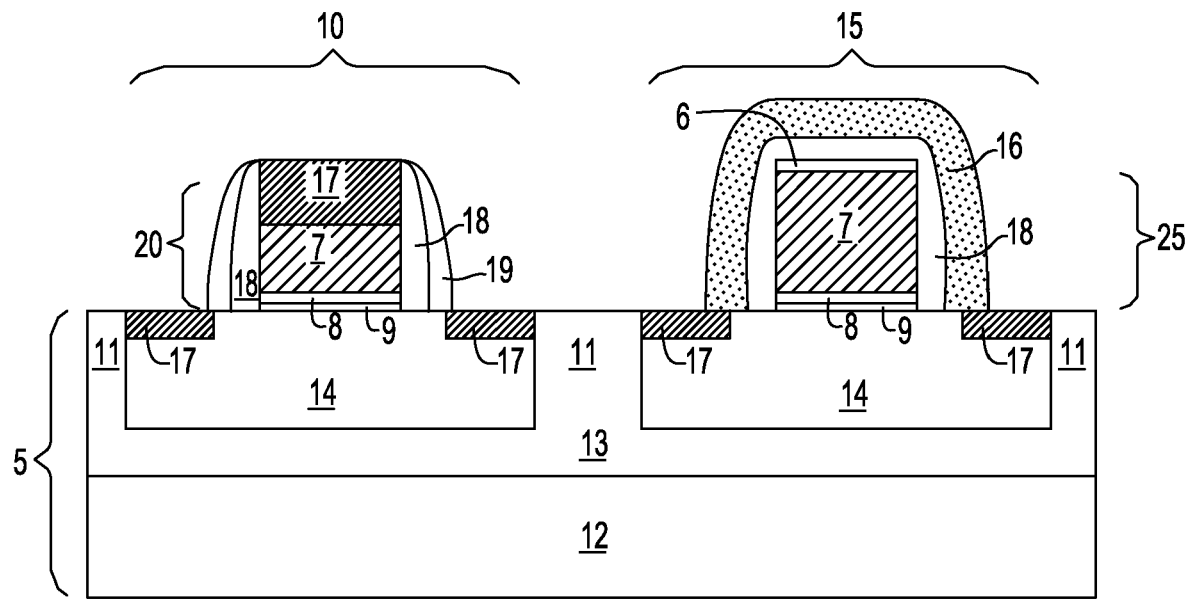
FIG. 4 is a side cross-sectional view depicting forming a metal semiconductor alloy atop an upper surface of the first gate stack in the first device region, in accordance with one embodiment of the present method.

FIG. 4 depicts forming a metal semiconductor alloy 17 atop an upper surface of the first gate stack 20 in the first device region 10. The metal semiconductor alloy 17 may also be formed on the surfaces of the upper semiconductor layer 14 that correspond to the source and drain regions in the first device region 10 and the second device region 15. A "metal semiconductor alloy" is an alloy of a metal and a semiconductor. The metal semiconductor alloy 17 may include a semiconductor constituent that includes silicon, e.g., silicide, or germanium, e.g., germinide. A "silicide" is an alloy of a metal and silicon. In one embodiment, the metal semiconductor alloy is a silicide. Examples of silicides include, but are not limited to: nickel silicide (NiSi$_x$), erbium silicide, nickel platinum silicide (NiPt$_y$Si$_x$), platinum silicide (PtSi), cobalt silicide (CoSi$_x$), tantalum silicide (TaSi$_x$), titanium silicide (TiSi$_x$) and combinations thereof.

Metal semiconductor alloy 17 formation typically requires depositing a metal layer onto the surface of a semiconductor-containing material or wafer. Therefore, in order to form the metal semiconductor alloy 17 on the upper surface of the first gate stack 20, the etch stop layer 6 is removed prior to the deposition of the metal layer. The etch stop layer 6 may be removed using selective etching or chemical stripping methods. The second protective dielectric layer 16 that is present overlying the second gate stack 25 obstructs the formation of the metal semiconductor alloy 17 on the second gate stack 25. In some embodiments, the portion of the second protective dielectric layer 16 that is overlying the source and drain regions in the second device region 15 is removed to provide a semiconductor surface for the formation of metal semiconductor alloy 17 contacts to the source and drain regions in the second device region 15.

The metal layer for forming the metal semiconductor alloy 17 may be deposited by at least one of chemical vapor deposition (CVD), plasma-assisted CVD, high-density chemical vapor deposition (HDCVD), plating, sputtering, evaporation and chemical solution deposition. Metals deposited for silicide formation include Ta, Ti, W, Pt, Co, Ni, and combinations thereof. Following deposition, the structure is then subjected to an annealing step, which may include rapid thermal annealing. During annealing, the deposited metal reacts with Si forming a metal silicide.

Figure 5:
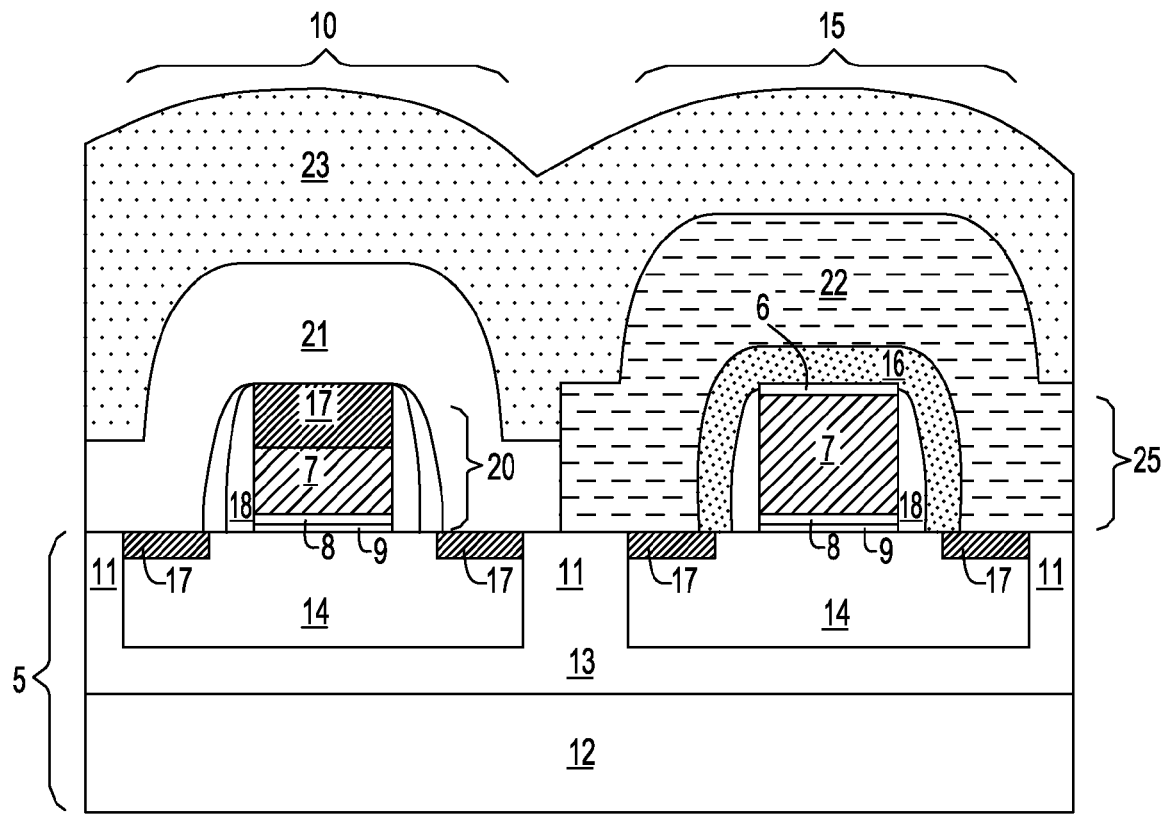
FIG. 5 is a side cross-sectional view depicting depositing a tensile stress inducing layer over the first device region, depositing a compressive stress inducing layer over the second device region (or depositing a same stress liner on both device regions), and depositing an interlevel dielectric over the first device region and the second device region, in accordance with one embodiment of the present method.

FIG. 5 depicts one embodiment of depositing a tensile stress inducing layer 21 over the first device region 10, depositing a compressive stress inducing layer 22 over the second device region 15, and depositing an interlevel dielectric 23 over the first device region 10 and the second device region 15. The term "stress inducing liner" and "stress inducing material" denotes a material having an intrinsic stress, in which the intrinsic stress effectuates a stress in an underlying material. The term "compressive stress inducing material" denotes a material having an intrinsic compressive stress, in which the intrinsic compressive stress produces a compressive stress in an underlying material. The term "tensile stress inducing material" denotes a material layer having an intrinsic tensile stress, in which the intrinsic tensile stress produces a tensile stress in an underlying material.

In one embodiment, a tensile stress inducing layer 21 is formed overlying the first device region 10 that includes the first gate stack 20 to an n-type semiconductor device, e.g., n-type field effect transistor (nFET), and a compressive stress inducing layer 22 is formed overlying the second device region 15 that includes the second gate stack 25 to a p-type semiconductor device, e.g., p-type field effect transistor (pFET).

The tensile stress inducing layer 21 may be any material that is capable of introducing a tensile stress into the device channel that is underlying the first gate stack 20. Examples of such stress inducing materials, include, but are not limited to: Si$_3$N$_4$, SiC, silicon oxynitride and other like materials. Typically, the tensile stress inducing layer 21 is comprised of Si$_3$N$_4$. The tensile stress inducing layer 21 can be formed utilizing various chemical vapor deposition (CVD) processes including, for example, low pressure CVD, plasma enhanced CVD, rapid thermal CVD, BTBAS-based (C$_8$H$_{22}$N$_2$Si reacted with ammonia) CVD, where BTBAS is a modern metalorganic precursor for CVD applications.

Plasma enhanced chemical vapor deposition (PECVD) is one example of a deposition method that can provide tensile stress inducing layer 21 composed of nitride, e.g., silicon nitride, and having a tensile internal stress. The stress state of nitride-containing tensile stress inducing layer 21 deposited by PECVD can be controlled by changing the deposition conditions to alter the reaction rate within the deposition chamber. More specifically, the stress state of a tensile stress inducing layer 21 comprised of silicon nitride may be set by changing the deposition conditions such as: $SiH_4/N_2$/He gas flow rate, pressure, RF power, and electrode gap. Rapid thermal chemical vapor deposition (RTCVD) can provide nitride-containing tensile stress inducing layer 21. The magnitude of the internal tensile stress produced within nitride-containing tensile stress inducing layer 21 deposited by RTCVD can be controlled by changing the deposition conditions. More specifically, the magnitude of the tensile stress within strain tensile stress inducing layer 21 comprised of silicon nitride may be set by changing deposition conditions such as: precursor composition, precursor flow rate and temperature.

The tensile stress inducing layer 21 may have an as-deposited thickness from 20 nm to 150 nm. In another embodiment, the as-deposited thickness of the tensile stress inducing layer 21 ranges from 30 nm to 100 nm. The tensile stress inducing layer 21 is typically a conformal layer. The term "conformal" denotes a layer having a thickness that does not deviate from greater than or less than 30% of an average value for the thickness of the layer.

Following deposition, the tensile stress inducing layer 21 may be removed from the second device region 15 using deposition, photolithography and etch processes. For example, a second block mask (not shown) may be formed over the first device region 10 to protect the portion of the tensile stress inducing layer 21 contained therein. The second block mask may be composed of photoresist material and may be formed by deposition (such as, for example, CVD, PECVD, and spin-on coating) and photolithography. The exposed portion of the tensile stress inducing layer 21 is removed from the second device region 15. In one embodiment, the exposed tensile stress inducing layer 21 is removed utilizing an etching process that removes the tensile stress inducing layer 21 selective to the second block mask and the materials that are underlying the tensile stress inducing layer 21 in the second device region 15.

The compressive stress inducing layer 22 may be any material that is capable of introducing a compressive stress into the device channel that is underlying the second gate stack 25. Examples of such stress inducing materials, include, but are not limited to: $Si_3N_4$, SiC, silicon oxynitride and other like materials. Typically, the compressive stress inducing layer 22 is comprised of $Si_3N_4$. The compressive stress inducing layer 22 can be formed utilizing various chemical vapor deposition (CVD) processes including, for example, low pressure CVD, plasma enhanced CVD, rapid thermal CVD, BTBAS-based ($C_8H_{22}N_2Si$ reacted with ammonia) CVD, where BTBAS is a modern metalorganic precursor for CVD applications.

Plasma enhanced chemical vapor deposition (PECVD) is one example of a deposition method that can provide compressive stress inducing layer 22 composed of nitride, e.g., silicon nitride, and having a compressive internal stress. The stress state of nitride-containing compressive stress inducing layer 22 deposited by PECVD can be controlled by changing the deposition conditions to alter the reaction rate within the deposition chamber. More specifically, the stress state of a compressive stress inducing layer 22 comprised of silicon nitride may be set by changing the deposition conditions such as: $SiH_4/N_2$/He gas flow rate, pressure, RF power, and electrode gap. Although wishing not to be limited, it is believed that the incorporation of H into the nitride-containing compressive stress inducing layer 22 increases the compressive nature of the layer.

The compressive stress inducing layer 22 may have an as-deposited thickness from 20 nm to 150 nm. In another embodiment, the as-deposited thickness of the compressive stress inducing layer 22 ranges from 30 nm to 100 nm. The compressive stress inducing layer 22 is typically a conformal layer. The compressive stress inducing layer 22 may be removed from the first device region 10 using deposition, photolithography and etch processes similar to those used for removing the tensile stress inducing layer 21 from the second device region 15.

An interlevel dielectric layer 23 can be deposited atop the entire semiconductor substrate 5 including the tensile stress inducing layer 21 and the compressive stress inducing layer 22. The interlevel dielectric layer 23 may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, α-C:H). Additional choices for the interlevel dielectric layer 23 include: any of the aforementioned materials in porous form, or in a form that changes during processing to or from being porous and/or permeable to being non-porous and/or non-permeable. The blanket layer of the interlevel dielectric layer 23 may be formed by deposition processes, including, but not limited to spinning from solution, spraying from solution, chemical vapor deposition (CVD), plasma enhanced CVD (PECVD), sputter deposition, reactive sputter deposition, ion-beam deposition, and evaporation.

Figure 6:
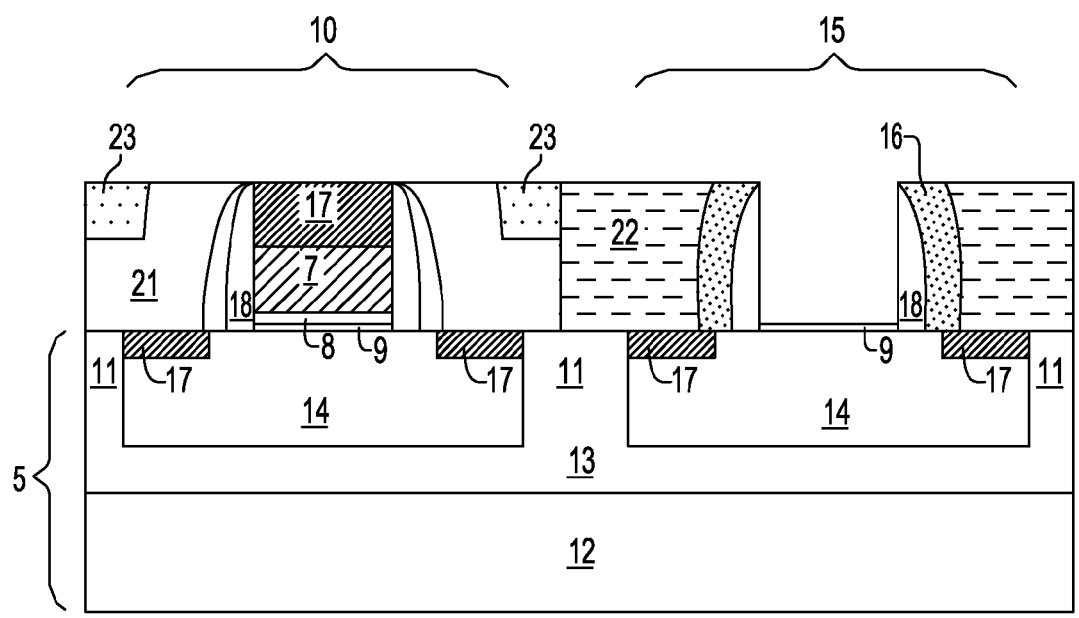
FIG. 6 is a side cross-sectional view depicting removing a portion of the second gate stack that is present in the second device region to expose the gate dielectric, in accordance with one embodiment of the present invention.

Referring to FIG. 6, in one embodiment, the interlevel dielectric layer 23 is planarized until the upper surface of the metal semiconductor alloy 17 of the first gate stack 20, and the upper surface of the etch stop layer 6 or the semiconductor-containing material 7 of the second gate stack 25 has been exposed. The planarization of the interlevel dielectric layer 23 may also remove a portion of the tensile stress inducing layer 21, and the compressive stress inducing layer 22. Planarization is a material removal process that employs at least mechanical forces, such as frictional media, to produce a planar surface. One example of planarization is chemical mechanical planarization (CMP). Chemical mechanical planarization (CMP) is a material removal process using both chemical reactions and mechanical forces to remove material and planarize a surface.

FIG. 6 further depicts one embodiment of removing a portion of the second gate stack 25 that is present in the second device region 15. In one embodiment, the portion of the second gate stack 25 that is removed includes the etch stop layer 6, the semiconductor-containing material 7, and the n-type work function metal layer 8 to provide an exposed gate dielectric 9. In one example, the portion of the second gate stack 25 is removed by an etch process that is selective to at least the metal semiconductor alloy 17 that is present atop the first gate stack 20 and the interlevel dielectric 23. The selective etch process may include multiple stages of selective etch chemistries. In one embodiment, the selective etch process that removes a portion of the second gate stack 25 is also selective to the gate dielectric 9.

Although not depicted in the figures, and in some embodiments, the n-type work function metal layer 8 may remain in the second gate stack 25. In this embodiment, the semiconductor containing material 7 may be removed selective to the n-type work function metal layer 8. For example, when the semiconductor-containing material is composed of polysilicon and the n-type work function metal layer 8 is composed of TiN, the semiconductor-containing material may be removed using bromide gas etch chemistries, i.e., HBr, having a high selectivity to the TiN, or by Chemical etch containing ammonia (NH$_4$OH) or TMAH.

Figure 7:
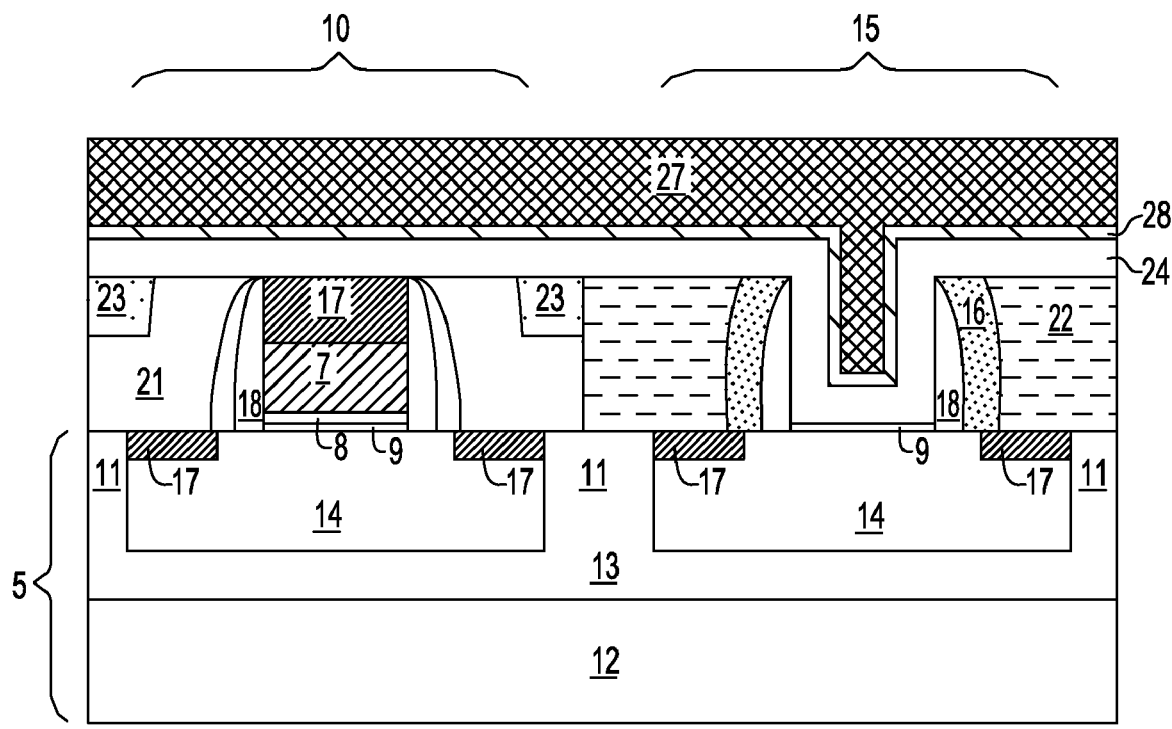
FIG. 7 is a side cross-sectional view depicting forming a p-type work function metal layer on the gate dielectric in the second device region, and forming a metal fill on the p-type work function metal layer, in accordance with one embodiment of the present invention.

FIG. 7 depicts one embodiment of forming a p-type work function metal layer 24 on the gate dielectric 9 in the second device region 15, and forming a metal fill 27 on the p-type work function metal layer 24, in accordance with one embodiment of the present invention.

In one embodiment, the p-type work function metal layer 24 is conformally deposited in the first device region 10 and the second device region 15 of the semiconductor substrate 5, in which the p-type work function metal layer 24 is deposited over the gate dielectric 9 of the second gate stack 25 in the second device region 15. As used herein, a "p-type work function metal layer 24" is a metal layer that effectuates a p-type threshold voltage shift. In one embodiment, the work function of the p-type work function metal layer 24 ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero.

In one embodiment, the p-type work function metal layer 24 may be composed of titanium or known as high vacuum work function metals and their nitrided/carbide and may be deposited in direct contact with the gate dielectric 9 of the second gate stack 25. In one embodiment, the p-type work function metal layer 24 is composed of TiN. The p-type work function metal layer 24 may also be composed of TiAlN, Ru, Pt, Mo, Co and alloys and combinations thereof.

The p-type work function metal layer 24 may be blanket deposited over the first device region 10 and the second device region 15, in which the p-type work function metal layer may be in direct contact with the gate dielectric 9. More specifically, at least a portion of the p-type work function metal layer 24 is formed within the via that exposes the gate dielectric. In one embodiment, the p-type work function metal layer 24 is a conformally deposited layer that may also be present on the sidewall of the via to the gate dielectric 9. The p-type work function metal layer 24 may have a thickness ranging from 1 nm to 20 nm. In another embodiment, the thickness of the metal layer 24 ranges from 5 nm to 10 nm.

In one embodiment, the p-type work function metal layer 24 comprising titanium and aluminum may be deposited by a physical vapor deposition (PVD) method, such as sputtering. As used herein, "sputtering" means a method for depositing a film of metallic material, in which a target of the desired material, i.e., source, is bombarded with particles, e.g., ions, which knock atoms from the target, where the dislodged target material deposits on a deposition surface. Examples of sputtering apparatus that may be suitable for depositing the p-type work function metal layer 24 include DC diode type systems, radio frequency (RF) sputtering, magnetron sputtering, and ionized metal plasma (IMP) sputtering. In addition to physical vapor deposition (PVD) techniques, the p-type work function metal layer may also be formed using chemical vapor deposition (CVD) and atomic layer deposition (ALD).

Still referring to FIG. 7, in some embodiments, a layer or layers of metals (or metal nitride) 28 may be formed in direct contact with the p-type work function metal layer 24. This layer(s) 28 may be composed of a titanium containing or tantalum containing layer. The thickness of this layer 28 typically ranges from 1 nm to 10 nm. In some embodiments, the barrier layer 28 may be omitted.

FIG. 7 further depicts forming a metal fill 27 within to via to the gate dielectric 9 of the second gate stack 25. In some embodiments, the metal fill 27 is formed in direct contact with the p-type work function metal layer 24 or the barrier layer 28 (when present). In one embodiment, the metal fill 27 is composed of pure aluminum. In another embodiment, the metal fill 27 is composed of aluminum alloy doped with metals such as Ti or Cu. The metal fill 27 is typically deposited by physical vapor deposition (PVD), such as sputtering. Then heat treatment can be applied for complete filling of trench with aluminum. Examples of sputtering apparatus that may be suitable for depositing the metal fill 27 comprising aluminum includes DC diode type systems, radio frequency (RF) sputtering, magnetron sputtering, and ionized metal plasma (IMP) sputtering. In addition to physical vapor deposition (PVD) techniques, the metal fill 27 comprising aluminum may also be formed using chemical vapor deposition (CVD).

In one embodiment, a sputtering deposition process for depositing the metal fill 27 that is composed of aluminum includes applying high energy particles to strike a solid slab of high-purity aluminum target material, in which the high energy particles physically dislodge atoms of the aluminum to be deposited on the gate dielectric 9. In one example, the ion energies of the high-energy particles, e.g., positive ions from an argon gas flow discharge, range from 500 eV to 5,000 eV. In another embodiment, the ion energies of the high-energy particles range from 1,500 eV to 4,500 eV. In one embodiment, by high-purity aluminum it is meant that the aluminum content of the target material is greater than 99.5%. In some embodiments, the aluminum content of the target material may be as great as 99.9% with a remainder of incidental impurities. "Incidental impurities" denote any contamination of the target, i.e., aluminum. Allowable ranges of impurities are less than 0.05 wt % for each impurity constituent, and 0.1 wt % for total impurity content. The sputtered aluminum atoms from the aluminum target may migrate through a vacuum and deposit on the deposition surface, e.g., the gate dielectric 9. In one example, iron (Fe), copper (Cu), and silver (Ag) may be present in less than 5 parts per million (ppm).

Figure 8:
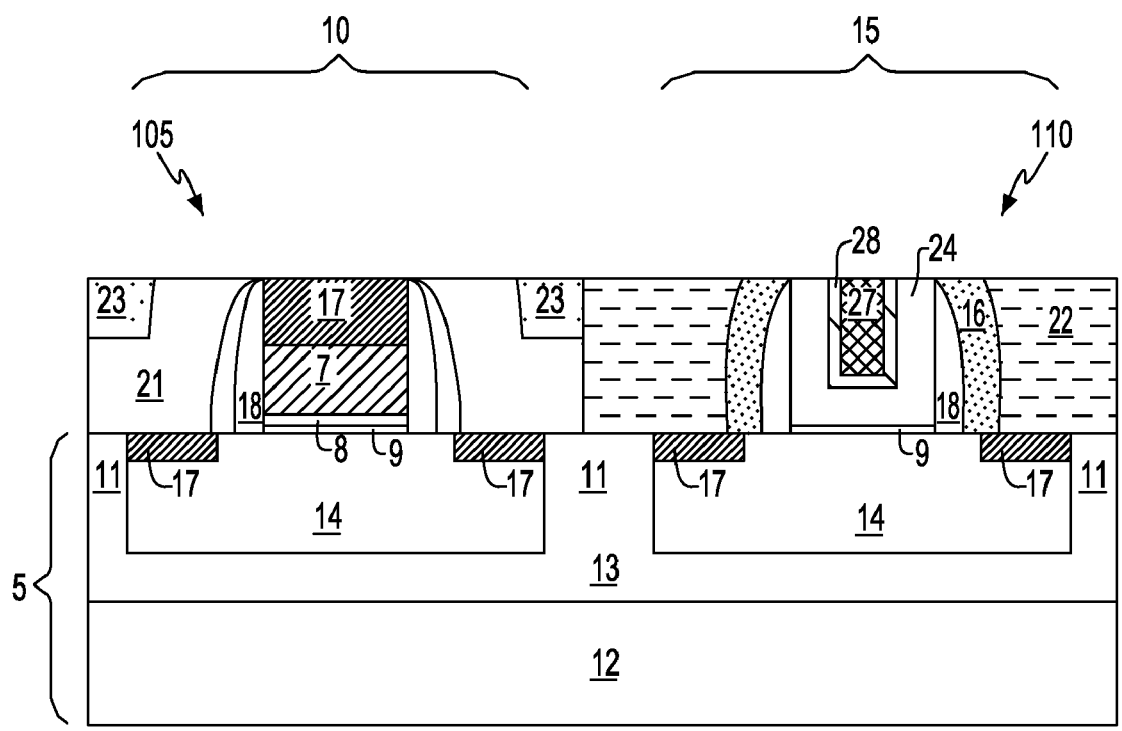
FIG. 8 is a side cross-sectional view depicting planarizing the structure that is depicted in FIG. 7.

The metal fill comprising aluminum 27 may be planarized until an upper surface of the metal fill 27 is coplanar with an upper surface of the interlevel dielectric 23, as depicted in FIG. 8. In one example, the planarization process is provided by chemical mechanical planarization (CMP). In one embodiment, the planarization process removes the portions of the p-type work function metal layer 24, the barrier layer 28 and the metal fill 27 that is present on the upper surface of the interlevel dielectric 23.

FIG. 8 depicts one embodiment of the semiconductor structure produced by a method for forming a complementary metal oxide semiconductor (CMOS) device that includes forming an n-type conductivity semiconductor device 105 in a first device region 10 of a semiconductor substrate 5 using a gate structure first process, and forming a p-type conductivity semiconductor device 110 in the second device region 15 using a gate structure last process. The functional gate structure of the n-type conductivity semiconductor device 105 is composed of the same layers as the originally formed first gate stack 20. The functional gate structure of the p-type conductivity semiconductor device 110 is composed of materials, i.e., p-type work function metal layer 24, metal fill 27 and optional barrier layer 28, that are formed in the volume that was previously occupied by the materials of replacement gate structures, such as the semiconductor-containing material 7 of the second gate stack 25.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a complementary metal oxide semiconductor (CMOS) device comprising:
   providing a semiconductor substrate comprising a first device region and a second device region;
   forming a first gate stack in the first device region and a second gate stack in the second device region, wherein each of the first gate stack and the second gate stack includes a gate dielectric that is present on the semiconductor substrate, an n-type work function metal layer that is present on the gate dielectric, and a semiconductor-containing material that is present on the n-type work function metal layer;
   forming source regions and drain regions of an n-type dopant in the first device region adjacent to the first gate stack, and source and drain regions of a p-type dopant in the second device region adjacent to the second stack;
   forming at least one dielectric layer atop the first device region and the second device region, wherein the at least one dielectric layer has an upper surface that is coplanar with an upper surface of the first gate stack and the second gate stack;
   removing the semiconductor-containing material and the n-type work function metal layer from the second gate stack to expose the gate dielectric in the second device region, wherein the semiconductor-containing material and the n-type work function metal layer remain in the first gate stack that is present in the first device region; and
   forming a p-type work function metal layer on the gate dielectric that is present in the second device region, wherein the first gate stack comprising the n-type work function metal layer and the gate dielectric is the gate structure to an n-type semiconductor device, and the second gate stack comprising the p-type work function metal layer and the gate dielectric is the gate structure to a p-type semiconductor device.

2. The method of claim 1, wherein the gate dielectric comprises a high-k dielectric layer that is deposited in direct contact with the semiconductor substrate.

3. The method of claim 2, wherein prior to the forming of the at least one dielectric layer atop the first device region and the second device region, Si:C wells are formed in portions of the semiconductor substrate that are adjacent to a portion of the semiconductor substrate on which the second gate stack is present.

4. The method of claim 1, wherein forming the first gate stack and the second gate stack further comprises:
   forming a hard mask layer on the semiconductor-containing material;
   forming a patterned etch mask atop the hard mask layer; and
   etching the hard mask layer, the semiconductor-containing material, the n-type work function metal layer and the gate dielectric to form the first gate stack and the second gate stack.

5. The method of claim 4, wherein the forming of the at least one dielectric layer that is atop the first device region and the second device region comprises:
   depositing a tensile stress inducing layer over the first device region;
   depositing a compressive stress inducing layer over the second device region;
   depositing an interlevel dielectric over the first device region and the second device region; and
   planarizing the upper surface of the interlevel dielectric, the compressive stress inducing layer and the tensile stress inducing layer until the upper surface of the first gate stack and the second gate stack is exposed.

6. The method of claim 5 further comprising forming a blocking dielectric layer over the second gate stack in the second device region and forming a metal semiconductor alloy region on at least an upper surface of the semiconductor-containing material of the first gate stack in the first device region.

7. The method of claim 6, wherein the removing of the n-type work function metal layer from the second gate stack to expose the gate dielectric in the second device region comprises:
   etching the semiconductor-containing material of the second gate stack selective to the at least one dielectric layer, the metal semiconductor alloy region of the first gate stack, and the n-type work function metal layer; and
   etching the n-type work function metal layer selective to the gate dielectric layer.

8. The method of claim 7, wherein a diffusion barrier is present on the gate dielectric layer in the second gate stack, and the n-type work function metal layer is removed from the second gate stack by an etch that is selective to the diffusion barrier that is present on gate dielectric layer.

9. The method of claim 7, wherein the forming of p-type work function metal layer on the gate dielectric that is present in the second device region comprises conformal deposition of the p-type work function metal layer on the gate dielectric in the second device region, and the interlevel dielectric in the first device region and the second device region, wherein the p-type work function metal layer is in contact with sidewalls of the compressive strain inducing layer that are exposed by the etching of the semiconductor-containing material selective to the at least one dielectric layer.

10. The method of claim 9 wherein the forming of the aluminum-containing gate conductor comprises depositing an aluminum-containing fill over the first device region and the second device region and on the p-type work function metal layer, and planarizing until an upper surface aluminum-containing fill is coplanar with an upper surface of the interlevel dielectric, wherein the planarizing removes the aluminum-containing fill and the p-type work function metal layer from the first device region.

11. The method of claim 1, wherein the forming the source region and the drain region of the n-type dopant, and the source region and the drain region of the p-type dopant comprises:
   forming a spacer on a sidewall of the first gate stack and the second gate stack; and
   implanting dopants into the semiconductor substrate using a block mask to select which of the first device region and the second device region is to be implanted.

12. The method of claim 1, wherein prior to the forming of the at least one dielectric layer atop the first device region and the second device region, SiGe wells are formed in portions of the semiconductor substrate that are adjacent to a portion of the semiconductor substrate on which the second gate stack is present.

* * * * *